United States Patent
Wang

(10) Patent No.: US 10,101,615 B2
(45) Date of Patent: Oct. 16, 2018

(54) ARRAY SUBSTRATE AND MANUFACTURING METHOD THEREOF, LIQUID CRYSTAL PANEL AND DISPLAY DEVICE

(71) Applicant: BOE TECHNOLOGY GROUP CO., LTD., Beijing (CN)

(72) Inventor: Xiaolin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 14/402,946

(22) PCT Filed: Nov. 30, 2013

(86) PCT No.: PCT/CN2013/088248
§ 371 (c)(1),
(2) Date: Nov. 21, 2014

(87) PCT Pub. No.: WO2015/043055
PCT Pub. Date: Apr. 2, 2015

(65) Prior Publication Data
US 2016/0252787 A1    Sep. 1, 2016

(30) Foreign Application Priority Data

Sep. 26, 2013   (CN) .......................... 2013 1 0446572

(51) Int. Cl.
*H01L 29/04*       (2006.01)
*G02F 1/1343*      (2006.01)
(Continued)

(52) U.S. Cl.
CPC .. *G02F 1/134363* (2013.01); *G02F 1/133345* (2013.01); *G02F 1/136286* (2013.01);
(Continued)

(58) Field of Classification Search
CPC ............... H01L 27/124; H01L 27/1459; H01L 29/78633; G02F 1/133345; G02F 1/134363; H02F 1/136286
(Continued)

(56) References Cited

U.S. PATENT DOCUMENTS 7,190,429 B2 *   3/2007   Yoshida ............ G02F 1/133707
                                                      349/123
7,863,612 B2 *   1/2011   Sato ...................... H01L 27/124
                                                      257/211
(Continued)

FOREIGN PATENT DOCUMENTS

CN       101900913 A      12/2010
CN      2011-237836 A     11/2011
(Continued)

OTHER PUBLICATIONS

Third Chinese Office Action dated Jul. 5, 2016; Appln. No. 201310446572.8.

(Continued)

*Primary Examiner* — Hung Vu
(74) *Attorney, Agent, or Firm* — Ladas & Parry LLP

(57) ABSTRACT

An array substrate includes: a base substrate; a sub-pixel region on the base substrate in which a first electrode and a second electrode are disposed; and a first insulating layer between the first electrode and the second electrode for insulating the first electrode and the second electrode. One of the first electrode and the second electrode is a common electrode and the other is a pixel electrode. A surface of at least one of the first electrode and the second electrode is a curved surface. The array substrate is intended to provide a liquid crystal panel and a display device with high light transmittance in sub-pixel regions. A manufacturing method of an array substrate is further disclosed.

19 Claims, 3 Drawing Sheets

(51) Int. Cl.
  *G02F 1/1333*   (2006.01)
  *G02F 1/1362*   (2006.01)
  *H01L 27/12*    (2006.01)
  *H01L 29/786*   (2006.01)

(52) U.S. Cl.
  CPC ........ *H01L 27/124* (2013.01); *H01L 27/1259* (2013.01); *H01L 29/78633* (2013.01); *G02F 2001/134345* (2013.01)

(58) Field of Classification Search
  USPC ........ 257/59, 72; 438/30, 48, 128, 149, 151, 438/157, 283
  See application file for complete search history.

(56) References Cited

U.S. PATENT DOCUMENTS

| | | | |
|---|---|---|---|
| 8,264,144 B2* | 9/2012 | Oikawa | H01L 51/003 313/506 |
| 2007/0002236 A1 | 1/2007 | Kim | |
| 2010/0302492 A1* | 12/2010 | Kubota | G02F 1/134363 349/138 |
| 2013/0105831 A1 | 5/2013 | Li et al. | |
| 2014/0049732 A1 | 2/2014 | Xie et al. | |
| 2014/0097407 A1* | 4/2014 | Oh | H01L 51/5203 257/40 |

FOREIGN PATENT DOCUMENTS

| | | |
|---|---|---|
| CN | 202256974 U | 5/2012 |
| CN | 102629055 A | 8/2012 |
| CN | 103151359 A | 6/2013 |
| CN | 103293811 A | 9/2013 |
| CN | 103323993 A | 9/2013 |
| CN | 203480176 U | 3/2014 |

OTHER PUBLICATIONS

First Chiese Office Action Appln. No. 201310446572.8; dated Jul. 1, 2015.
International Search Report Appln. No. PCT/CN2013/088248; dated Jul. 8, 2014.
Second Chinese Office Action dated Feb. 22, 2016; Appln. No. 201310446572.8.
International Preliminary Report on Patentability dated Mar. 29, 2016; PCT/CN2013088248.

* cited by examiner

ARRAY SUBSTRATE AND MANUFACTURING METHOD THEREOF, LIQUID CRYSTAL PANEL AND DISPLAY DEVICE

TECHNICAL FIELD

Embodiments of the present invention relate to an array substrate and a manufacturing method thereof, a liquid crystal panel and a display device.

BACKGROUND

Thin film transistor liquid crystal displays (TFT-LCDs) play a dominant role in current flat display market due to their features of small volume, low power consumption, no irradiation and so on.

Liquid crystal displays can be classified in terms of display modes into Twisted Nematic (TN) type, In Plane Switching (IPS) type, Advanced Super Dimension Switch (ADS) type, etc. In an ADS mode liquid crystal display, a multi-dimensional electric field is formed with both an electric field produced at edges of slit electrodes on the same plane and an electric field produced between a slit electrode layer and a planar common electrode layer disposed in a different layer in the liquid crystal display, which is mainly a horizontal electric field so that liquid crystal molecules at all orientations, which are located between the slit electrodes and directly above the slit electrodes in a liquid crystal cell, can be rotated, which enhances the work efficiency of the liquid crystal and increases light transmittance.

For different applications, improved technologies of ADS include high transmittance I-ADS technology, high aperture ratio H-ADS, high resolution S-ADS technology and so on.

For a current ADS liquid crystal panel, in non-display areas around sub-pixel areas, various electrode structures such as gate lines or data lines are inevitably disposed. Since pixel electrodes and common electrodes are in different layers, electric field formed between them is influenced by electrode structures around sub-pixels, particularly by the insulating layer distributed over gate lines and data lines, causing certain attenuation to the electric field. In addition, due to the limited area of sub-pixel display areas and the planar structure of common electrodes, the strength of electric field between common electrodes and pixel electrodes is not ideal, especially the strength of electric field between edges of common electrodes and pixel electrodes is small, which influences penetration ratio of light in sub-pixel areas, and is disadvantageous to realize liquid crystal panels and display devices with high transmittance and wide viewing angle.

SUMMARY

Embodiments of the present invention provide an array substrate, a liquid crystal panel and a display device for providing a liquid crystal panel and a display device with high light transmittance in sub-pixel areas.

An embodiment of the present invention provides an array substrate including: a base substrate; a sub-pixel region on the base substrate in which a first electrode and a second electrode are disposed; and a first insulating layer between the first electrode and the second electrode. One of the first electrode and second electrode is a common electrode and the other is a pixel electrode. A surface of at least one of the first electrode and the second electrode is a curved surface.

For example, the array substrate may further include a second insulating layer between the base substrate and the second electrode, wherein the second insulating layer has a groove region extending in a first direction and the second electrode is disposed on the second insulating layer in compliance with the second insulating layer's shape to be formed in a groove shape.

For example, the base substrate has a groove region extending in a first direction and the second electrode is disposed on the base substrate in compliance with the base substrate's shape to be formed in a groove shape.

For example, a longitudinal section of the groove region in a second direction perpendicular to the first direction is of a reversed trapezoid.

For example, an angle between at least one side surface of the second electrode of groove shape and the base substrate is neither 0° nor 90°.

For example, the angle between at least one of the two side surfaces of the second electrode of groove shape and the base substrate is 40°~75°.

For example, a depth of the groove region of the second insulating layer is equal to or less than a thickness of a region other than the groove region.

For example, the first electrode consists of one or more sub-electrodes extending in a first direction and a shortest distance between the sub-electrodes and two side surfaces of the second electrode of groove shape is 1~4.5 μm.

For example, the array substrate may further include: a plurality of gate lines provided in the first direction and a plurality of data lines provided in the second direction perpendicular to the first direction around sub-pixels, the second insulating layer being on the gate lines; or a plurality of data lines provided in the first direction and a plurality of gate lines provided in the second direction perpendicular to the first direction around sub-pixels, the second insulating layer being on the data lines.

For example, the second insulating layer is transparent resin or black light blocking resin.

An embodiment of the present invention provides a manufacturing method of an array substrate, including: forming a pattern of a first electrode and a pattern of a second electrode in a sub-pixel region on a base substrate and a first insulating layer between the first electrode and the second electrode; one of the first electrode and second electrode is the common electrode and the other is the pixel electrode; wherein a surface of at least one of the first electrode and the second electrode is a curved surface.

For example, forming a pattern of a first electrode and a pattern of a second electrode in a sub-pixel region on a base substrate and a first insulating layer between the first electrode and the second electrode is specifically conducted by: forming a second insulating layer of a thickness on the base substrate and forming a groove region extending in a first direction in a preset region of the second insulating layer; forming a conductive layer on the base substrate with the second insulating layer formed thereon, forming the pattern of the second electrode on the second insulating layer, with the second electrode disposed on the second insulating layer being in compliance with the second insulating layer's shape to be formed in a groove shape; forming an first insulating layer on the base substrate with the second electrode formed thereon, for insulating the second electrode and the first electrode to be formed; forming a conductive layer on the base substrate with the first insulating layer formed thereon, and forming the pattern of the first electrode on the first insulating layer.

For example, a depth of the groove region of the second insulating layer is equal to or less than a thickness of a region other than the groove region of the second insulating layer.

For example, forming a pattern of a first electrode and a pattern of a second electrode in a sub-pixel region on a base substrate and a first insulating layer between the first electrode and the second electrode is specifically conducted by: forming a groove region extending in a first direction in a preset region on the base substrate; forming a conductive layer on the base substrate with the groove region formed thereon, forming the pattern of the second electrode on the base substrate, with the second electrode disposed on the base substrate being in compliance with the base substrate's shape to be formed in a groove shape; forming the first insulating layer on the substrate with the second electrode formed thereon, for insulating the second electrode and the first electrode to be formed; forming a conductive layer on the base substrate with the first insulating layer formed thereon, and forming the pattern of the first electrode on the first insulating layer.

An embodiment of the present invention provides a liquid crystal panel including an array substrate of any of the above-mentioned modes.

An embodiment of the present invention provides a display device including the liquid crystal panel.

In summary, in the array substrate provided in embodiments of the present invention, the opposing area between the first electrode and the second electrode is increased, the strength of electric field formed between them is greater, especially the strength of electric field formed at edges of the sub-pixel region is greater, which enhances the effective electric field applied on the liquid crystal by edges of the sub-pixel region and improves light transmittance in the sub-pixel region.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
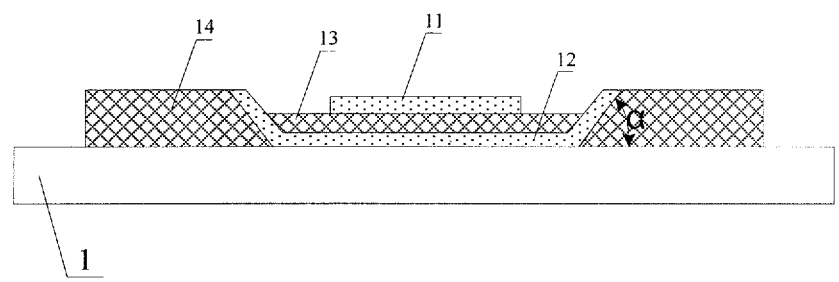
FIG. 1 is a first structure diagram of an array substrate provided in a first embodiment of the present invention.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Similarly, terms such as "a", "an" or "the" do not mean to limit quantity but represent the presence of at least one. The terms "comprises," "comprising," "includes," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

Embodiments of the present invention provide an array substrate and a manufacturing method thereof, a liquid crystal panel and a display device for providing a liquid crystal panel and a display device with high light transmittance in sub-pixel areas and providing a manufacturing method of array substrate with a simple manufacturing process.

Embodiments of the present invention provide an array substrate of improved an ADS mode and liquid crystal panel. The array substrate includes a base substrate and a sub-pixel on the base substrate and the area of the sub-pixels are provided with a first electrode and a second electrode. The array substrate further includes a first insulating layer between the first electrode and the second electrode for insulating the first electrode and the second electrode. One of the first electrode and second electrode is the common electrode and the other is the pixel electrode. The surface of at least one of the first electrode and the second electrode is a curved surface, thereby increasing the surface area of the pixel electrode and the common electrode. The strength of electric field formed between the pixel electrode and the common electrode is greater, and the strength of electric field formed at edges of the sub-pixel area (such as a red, green or blue sub-pixel area) is greater, which enhances effective electric field applied on the liquid crystal by edges of the sub-pixel area, and increases light transmittance of the sub-pixel area.

Preferably, the pixel electrode and the common electrode are stacked on each other. In one embodiment of the present invention, both the pixel electrode and the common electrode are of curved surface. In another embodiment, one of the pixel electrode and the common electrode is of curved surface. All the above-mentioned embodiments can enhance light transmittance in sub-pixel areas.

More preferably, the surface of the pixel electrode (or common electrode) above the base substrate that is closer to the base substrate is a curved surface, the surface of the common electrode (or pixel electrode) above the base substrate that is farther from the base substrate is a planar surface. In this way, the strength of electric field formed between the pixel electrode and the common electrode is greater, and the strength of electric field formed at edges of sub-pixel areas is greater, which enhances effective electric field applied on the liquid crystal by edges of the sub-pixel areas, and increases light transmittance of sub-pixel areas.

There are many implementations for the curved pixel electrode (or common electrode). Preferably, the pixel electrode or common electrode is arranged in a groove structure. A groove-like electrode structure includes side surfaces and a bottom surface. As compared to a planar electrode structure, a curved electrode structure can increase electrode area of the pixel electrode or common electrode, especially enhance strength of electric field at edges of the pixel electrodes, and enhance effective electric field applied on the liquid crystal by edges of the sub-pixel areas. Of course, curved pixel electrode or common electrode is not limited to the groove structure, and may also be of any other rugged structures.

It is to be noted that thicknesses of functional layers in drawings of the embodiments of the present invention do not reflect the actual thicknesses thereof, and relative thicknesses between various layers do not reflect the actual relative thicknesses. Accompanying drawings provided in embodiments of the present invention are only intended to schematically illustrate the present invention.

The array substrate and the manufacturing method thereof, the liquid crystal panel and the display device provided in embodiments of the present invention will be described in detail below with reference to accompanying drawings.

Description will be given below with a second electrode of groove shape as an example. There are at least the following two methods for forming the second electrode of groove shape.

First Method

A second insulating layer is disposed on the base substrate with a flat surface and patterned to form an insulating layer with groove regions, and a second electrode is disposed on the second insulating layer in compliance with the second insulating layer and forms a corresponding second electrode of groove shape. This method has advantages such as simple etching conditions for the second insulating layer and less difficult process.

Second Method

Groove-like regions are formed directly on the surface of the base substrate and the second electrode is disposed on the base substrate in compliance with the shape of the base substrate to form a corresponding second electrode of groove shape. This method has advantages that the second insulating layer is not needed, the groove regions are formed directly on the base substrate, and the array substrate has a thin thickness.

In embodiments of the present invention, glass substrate or flexible substrate may be used for the base substrate.

Description will be given below with a partial schematic diagram of an array substrate including one sub-pixel region (such as a red, green or blue sub-pixel region) as an example, that is, the layer structure only for one sub-pixel region in the array substrate. Array substrates including second electrodes formed with the above-mentioned two methods will be described in detail below respectively with reference to the accompanying drawings.

First Embodiment

FIG. 1 is a schematic cross section diagram of an array substrate provided in an embodiment of the present invention. The array substrate includes: a base substrate 1; a plurality of sub-pixels on the base substrate 1, wherein the region of each sub-pixel is provided with a first electrode 11, a second electrode 12, a first insulating layer 13 and a second insulating layer 14; the second insulating layer 14 is on the base substrate 1; the second electrode 12 is on the second insulating layer 14; the first insulating layer 13 is on the second electrode 12; and the first electrode 11 is on the first insulating layer 13. The second insulating layer 14 has a groove region extending in a first direction (the direction perpendicular to the paper as shown in FIG. 1), the second electrode 12 is disposed on the second insulating layer 14 in compliance with its shape to form the second electrode 12 with a curved surface, which has a groove-like shape.

The second electrode of groove shape 12 is located on the bottom and side surfaces of the groove of the groove-like second insulating layer.

One of the first electrode 11 and the second electrode 12 is the common electrode and the other is the pixel electrode. The common electrode (or pixel electrode) is of groove-like electrode structure. The pixel electrode (or common electrode) is over the groove-like electrode. Given a constant lateral width of the groove-like common electrode (or pixel electrode), the surface area increases, and the strength of electric field between the common electrode and the pixel electrode increases, especially the strength of electric field at edges of the sub-pixel region increases, which enhances effective electric field applied on the liquid crystal at edges of the sub-pixel region, thereby increase light transmittance in the sub-pixel region, and ultimately enhances display quality of images.

The first electrode may be of a groove-like structure similar to the second electrode, or may be a planar electrode structure, which is not limited here. For example, the second electrode 12 may also be formed as the second electrode 12 with a curved surface in compliance with the groove-like first insulating layer 13, which has a groove-like shape.

Preferably, referring to FIG. 1, the first electrode 11 is a planar electrode, and the second electrode 12 is a groove-like electrode.

Preferably, referring to FIG. 1, the longitudinal section of the groove region in a second direction perpendicular to the first direction is of a reversed trapezoid, namely, the bottom area of the groove is smaller than the opening area of the groove facing the bottom of the groove, and the groove is of a structure with wide top and narrow bottom. That is, the angle α between at least one side surface of the two side surfaces of the second electrode of groove shape 12 and the base substrate 1 is neither 0° nor 90° (that is, the angle α is greater than 0° and less than 90°). Of course, the angles α between two side surfaces of the second electrode of groove shape 12 and the base substrate 1 may or may not be equal to each other.

Furthermore, the angle α between two side surfaces of the second electrode of groove shape 12 and the base substrate 1 respectively may be 30°~75°.

Further, the angles α between at least one of the two side surfaces of the second electrode of groove shape 12 and the base substrate are equal, and preferably are 45°.

The angle α between at least one of the two side surfaces of the above-mentioned second electrode of groove shape extending in the first direction and the base substrate is not 90°, the two side surfaces of the groove has a certain slope angle with respect to the base substrate. Therefore, fracture or breakage is not likely to occur between the part of the second electrode located on the groove bottom and the part of the second electrode located on the side surfaces, which further increases yield of the array substrate.

Preferably, the depth of the groove region of the second insulating layer is equal to or less than the thickness of regions other than the groove region. When the thickness of the groove region of the second insulating layer is equal to the thickness of regions other than the groove region, which means no second insulating layer is disposed on the bottom of the groove region, and such arrangement may reduce the thickness of the array substrate.

Preferably, the second insulating layer may be, but not limited to, a layer made of transparent resin or black resin.

When the second electrode is located in the display area of a sub-pixel, the second insulating layer may be made of transparent resin to realize an aperture ratio that does not influence the pixels.

When the second electrode is located in the non-display area of a sub-pixel, for example, when the first electrode is the pixel electrode, the first electrode occupies almost the entire sub-pixel display area, the second electrode has an area greater than that of the first electrode, and two side surfaces of the second electrode in the first direction are located in the non-display areas between sub-pixel regions. Therefore, when the second insulating layer is made of a black resin layer, it is located in regions corresponding to the black matrix of the color filter substrate, and the black resin layer can further function as a black matrix to prevent light leak of the liquid crystal panel.

The first electrode provided in the first embodiment may be composed of one sub-electrode or a plurality of sub-electrodes.

Figure 2:
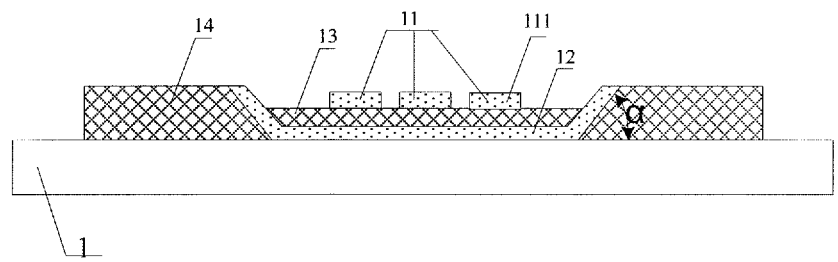
FIG. 2 is a second structure diagram of an array substrate provided in the first embodiment of the present invention.

Referring to FIG. 2, the first electrode 11 is composed of a plurality of sub-electrodes 111, which may be arranged parallel to each other for all or portion of the sub-electrodes 111. The arrangement of the plurality of sub-electrodes 111 is not limited.

Figure 3:
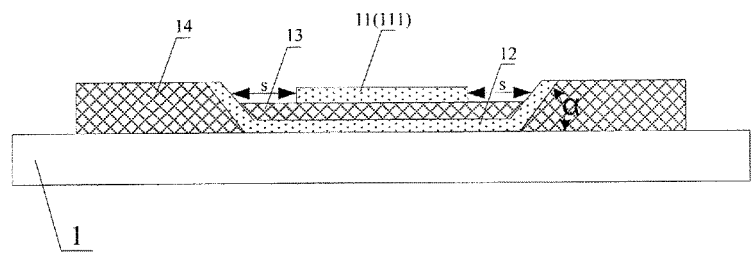
FIG. 3 is a third structure diagram of an array substrate provided in the first embodiment of the present invention.

As shown in FIG. 3, the first electrode 11 is composed of one sub-electrode 111 that is a strip electrode. The shortest distance s between two sides of the strip electrode (namely edges of the strip electrode extending in the first direction) and two side surfaces of the groove-like region may be about 1 μm~4.5 μm.

It is found by simulation with liquid crystal optics simulation software that the thickness of the second insulating layer may be 1.1 μm~3.6 μm, the width of the first electrode may be 2.5 μm~6 μm, and the efficiency of liquid crystal is improved by about one time. When the distance s is about 1 μm~4.5 μm, the efficiency of the liquid crystal is higher. Preferably, when the distance s is 1.5 μm~3.5 μm, the efficiency of the liquid crystal is even higher.

Preferably, in the array substrate described in the present invention, a plurality of gate lines provided in the first direction and a plurality of data lines distributed in a second direction perpendicular to the first direction are disposed between adjacent sub-pixels (that is, gate lines and data lines intersecting each other define the sub-pixels), and the second insulating layer is located on the gate lines. The second insulating layer can function as a depressed area on one hand and can reduce parasitic capacitance between gate lines and some other electrodes on the other hand, or prevent electric field around gate lines from electrically polarizing the black matrix layer which would induce charges on the surface of the black matrix, resulting in after-image of the liquid crystal panel.

Figure 4:
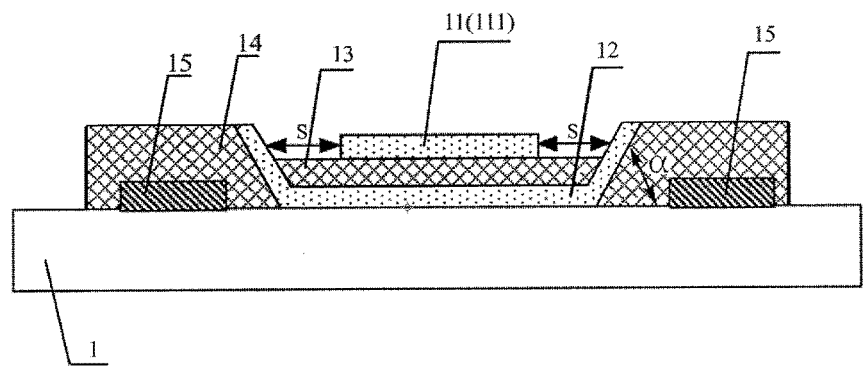
FIG. 4 is a fourth structure diagram of an array substrate provided in the first embodiment of the present invention.

Referring to FIG. 4, alternatively, in the array substrate described in the present invention, a plurality of data lines 15 distributed in the first direction and a plurality of gate lines provided in the second direction perpendicular to the first direction are disposed between adjacent sub-pixels (gate lines are not shown in FIG. 4), and the second insulating layer 14 is located on data lines 15 and cover the entire data lines 15. The second insulating layer 14 can function as a depressed area on one hand and can reduce parasitic capacitance between data lines and some other electrodes on the other hand, or prevent electric field around data lines from electrically polarizing the black matrix layer which would induce charges on the surface of the black matrix, resulting in after-image of the liquid crystal panel.

The array substrate provided in the above-mentioned embodiment of the present invention corresponds to an ADS mode liquid crystal panel, such as a hyper-fine single strip electrode pixel structure or common electrode structure. Forming a slope with a certain tilt angle near edges of the second electrodes of the base substrate may effectively enhance penetration ratio of pixels.

Second Embodiment

The array substrate of another mode provided in the second embodiment is different from the first embodiment in that the second electrode is formed in a different way. In the array substrate provided in the first embodiment, the second electrode is implemented according to the above-mentioned first method. In the array substrate provided in the second embodiment, the second electrodes are implemented according to the above-mentioned second method. In the first embodiment, except that the forming method of the second electrode is different from the second embodiment, other preferable implementations are all applicable to the second embodiment, for example, the arrangement of the first electrode, the angle between side surfaces of groove and the base substrate, the distance between the first electrode and the second electrode's side surface, and arrangement of data lines and gate lines and beneficial effects are all applicable to the second embodiment.

Figure 5:
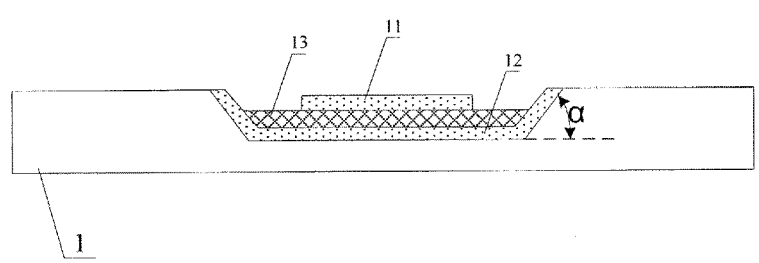
FIG. 5 is a structure diagram of an array substrate provided in a second embodiment of the present invention.

Referring to FIG. 5, the array substrate of the present embodiment includes: a base substrate 1; a plurality of sub-pixels on the base substrate 1, wherein the region of each sub-pixel is provided with a first electrode 11, a second electrode 12, and a first insulating layer 13; the second electrode 12 is on the base substrate 1; the first insulating layer 13 is on the second electrode 12; and the first electrode 11 is on the first insulating layer 13. The base substrate 1 has groove regions extending in the first direction thereon, the second electrodes 12 are disposed on the base substrate 1 in compliance with its shape to form the second electrodes 12 with curved surface, which has a groove-like shape.

The common electrode (or pixel electrode) is of a groove-like electrode structure, and the pixel electrode (or common electrode) is over the groove-like electrode. Given a constant lateral width of the groove-like common electrode (or pixel electrode), the surface area increases, and the strength of electric field between the common electrode and the pixel electrode increases, especially the strength of electric field at edges of the sub-pixel region increases, which enhances effective electric field applied on the liquid crystal at edges of the sub-pixel region, thereby increase light transmittance in the sub-pixel region, and ultimately enhances display quality of images.

Preferably, the first electrode and the second electrode provided in the first embodiment and the second embodiment are transparent conductive electrodes, such as indium tin oxide (ITO) or indium zinc oxide (IZO).

The above-mentioned two embodiments are only preferable implementations provided in the present invention. In specific implementations, the array substrate is not limited to the above-mentioned two implementations, for example, the first electrode and the second electrode are both of curved surfaces or the first electrode is of curved surface. The curved surface is not limited to a groove, and may also be of another structure. For the first electrode consisting of a plurality of sub-electrodes, it is possible to dispose a common electrode with curved surface in a region corresponding to every sub-electrode, or dispose a electrode with curved surface in a region corresponding to a sub-electrode near an edge, which is not limited specifically here.

The manufacturing method of the array substrate provided in the above-mentioned embodiments will be described in detail bellow.

Third Embodiment

The present embodiment provides a manufacturing method of an array substrate. The manufacturing method of the array substrate may be implemented as follows.

The pattern of a first electrode and the pattern of a second electrode pattern are formed in a sub-pixel region on the base substrate, and a first insulating layer between the first electrode and the second electrode is formed. One of the first electrode and second electrode is the common electrode and the other is the pixel electrode. The surface of at least one of the first electrode and the second electrode is a curved surface.

Figure 6:
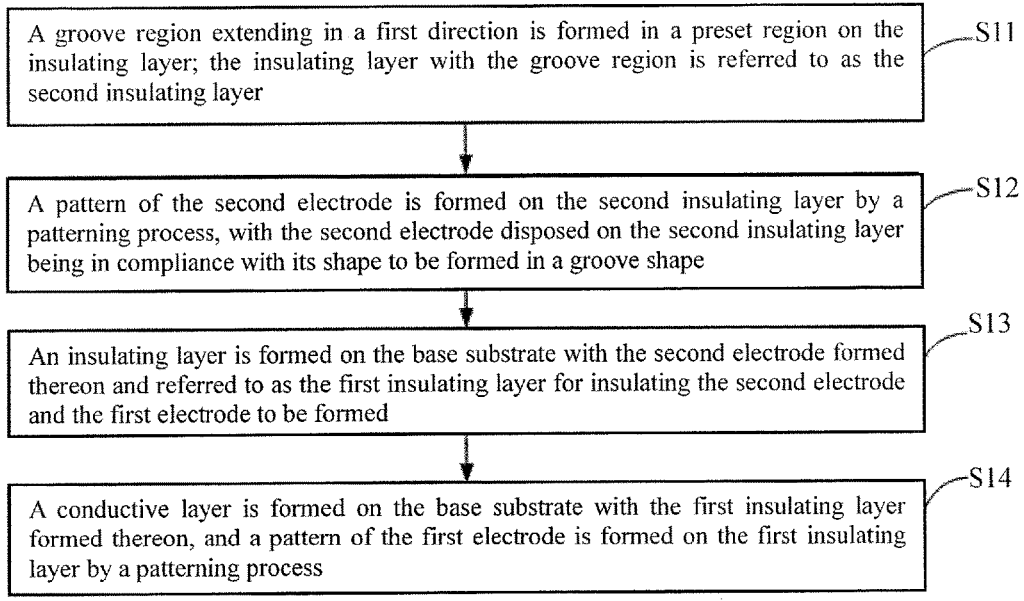
FIG. 6 is a first flow chart of a manufacturing method of array substrate provided in an embodiment of the present invention.

For the array substrate provided in the first embodiment, referring to FIG. 6, a specific example of forming the first electrode and the second electrode pattern in the sub-pixel region and the first insulating layer between the first electrode and the second electrode on the base substrate is conducted as follows.

S11. An insulating layer of a thickness is formed on the base substrate, and a groove region extending in a first direction is formed in a preset region on the insulating layer; the insulating layer with the groove region is referred to as the second insulating layer.

S12. A conductive layer is formed on the base substrate with the second insulating layer formed thereon, a pattern of the second electrode is formed on the second insulating layer by a patterning process, with the second electrode disposed on the second insulating layer being in compliance with its shape to be formed in a groove shape.

S13. An insulating layer is formed on the base substrate with the second electrode formed thereon; the insulating layer is referred to as the first insulating layer for insulating the second electrode and the first electrode to be formed;

S14. A conductive layer is formed on the base substrate with the first insulating layer formed thereon, and a pattern of the first electrode is formed on the first insulating layer by a patterning process.

Preferably, the depth of the groove region of the second insulating layer is equal to or less than the thickness of regions other than the groove region. When the thickness of the groove region of the second insulating layer is equal to the thickness of regions other than the groove region, which means no second insulating layer is disposed on the bottom of the groove region, and such arrangement may reduce thickness of the array substrate.

Figure 7:
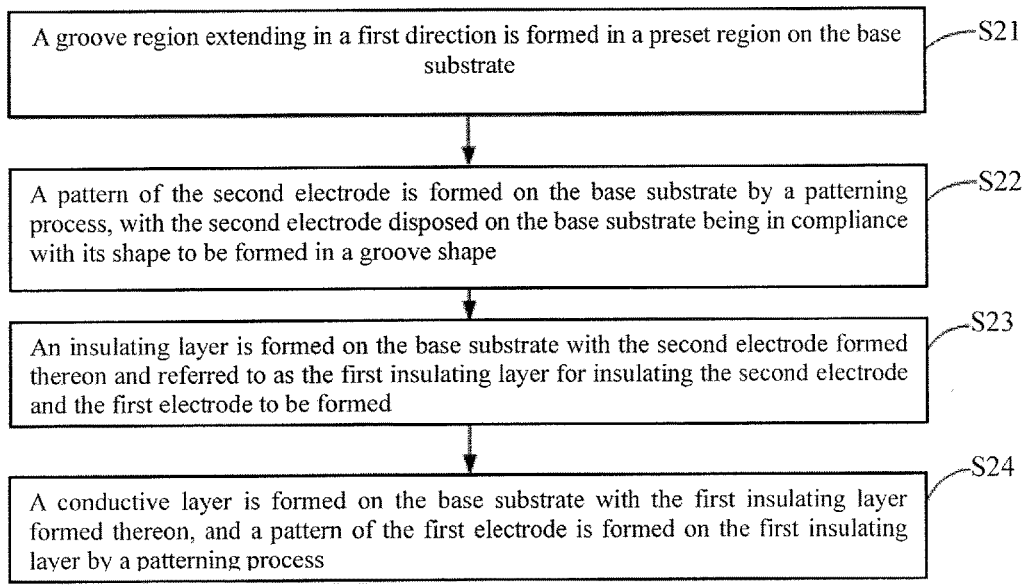
FIG. 7 is a second flow chart of a manufacturing method of array substrate provided in an embodiment of the present invention.

For the array substrate provided in the second embodiment, referring to FIG. 7, a specific example of forming the pattern of the first electrode and the pattern of the second electrode in the sub-pixel region and forming the first insulating layer between the first electrode and the second electrode on the base substrate is conducted as follows.

S21. A groove region extending in a first direction is formed in a preset region on the base substrate.

S22. A conductive layer is formed on the base substrate with the groove region formed thereon, a pattern of the second electrode is formed on the base substrate by a patterning process, with the second electrode disposed on the base substrate being in compliance with its shape to be formed in a groove shape.

S23. An insulating layer is formed on the base substrate with the second electrode formed thereon, with the insulating layer is referred to as the first insulating layer for insulating the second electrode and the first electrode to be formed.

S24. A conductive layer is formed on the base substrate with the first insulating layer formed thereon, and a pattern of the first electrode is formed on the first insulating layer by a patterning process.

Preferably, in the any one of the above-mentioned implementation methods of the array substrate, the angle between at least one of the two side surfaces of the second electrode of groove shape and the base substrate is neither 0° nor 90°.

Further, the angles between at least one of the two side surfaces of the second electrode of groove shape and the base substrate are 45°.

Preferably, the first electrode consists of one sub-electrode extending in a first direction and the shortest distance between the sub-electrode and two side surfaces of the second electrode of groove shape is 1 μm~4.5 μm.

Preferably, any one of the above-mentioned implementation methods of the array substrate further includes the process of manufacturing thin film transistors, gate lines and data lines.

Embodiments of the present invention further provide a liquid crystal panel including the array substrate of any of the above-mentioned modes. The liquid crystal panel may further include a color filter substrate disposed opposite to each other. Alternatively, the array substrate includes a color filter layer disposed on the array substrate, while the opposed substrate disposed oppositely to the array substrate requires no color filter layer any more. The provision of the color filter is not limited as long as the liquid crystal display panel of embodiments of the present invention includes the array substrate provided in the above-mentioned embodiments.

"Patterning process" as used in the disclosure may include portion or all steps of film formation, exposure, development, photolithography and etching. The film formation process may be implemented by deposition, spin coating and coating.

Embodiments of the present invention provide a display device including the above-mentioned liquid crystal panel, which may be a liquid crystal panel, a liquid crystal display or a liquid crystal TV.

In summary, embodiments of the present invention provide an array substrate including: a base substrate; a sub-pixel region on the base substrate in which a first electrode and a second electrode are disposed; and a first insulating layer between the first electrode and the second electrode for insulating the first electrode and the second electrode. One of the first electrode and second electrode is the common electrode and the other is the pixel electrode. A surface of at least one of the first electrode and the second electrode is a curved surface. Thereby the surface area of the pixel electrode and the common electrode is increased. The strength of electric field formed between the pixel electrode and the common electrode is greater, and the strength of electric field formed at edges of sub-pixel areas (such as red, green or blue sub-pixel areas) is greater, which enhances effective electric field applied on the liquid crystal by edges of the sub-pixel areas, and increases light transmittance of sub-pixel areas.

What are described above is related to the illustrative embodiments of the disclosure only and not limitative to the scope of the disclosure; the scopes of the disclosure are defined by the accompanying claims.

The invention claimed is:

1. An array substrate comprising:
   a base substrate;
   a sub-pixel region on the base substrate in which a first electrode and a second electrode are disposed; and
   a first insulating layer between the first electrode and the second electrode;
   wherein a surface the second electrode is a curved surface, the second electrode is of a groove shape and comprises two opposite side surfaces, the first electrode is provided on the second electrode and comprises two opposite side surfaces, and the two side surfaces of the first electrode are between the two side surfaces of the second electrode;
   the two side surfaces of the first electrode are two edge portions of the first electrode of the sub-pixel region, the two side surfaces of the second electrode are two edge portions of the second electrode of the sub-pixel region; and
   a remaining portion of the second electrode is closer to the base substrate than the two edge portions of the second electrode.

2. The array substrate of claim 1, further comprising a second insulating layer between the base substrate and the second electrode,
   wherein the second insulating layer has a groove region extending in a first direction and the second electrode is disposed on the second insulating layer in compliance with the second insulating layer's shape to be formed in the groove shape.

3. The array substrate of claim 2, wherein a longitudinal section of the groove region in a second direction perpendicular to the first direction is of a reversed trapezoid.

4. The array substrate of claim 3, wherein an angle between at least one side surface of the second electrode of the groove shape and the base substrate is neither 0° nor 90°.

5. The array substrate of claim 2, wherein a depth of the groove region of the second insulating layer is equal to or less than a thickness of a region other than the groove region.

6. The array substrate of claim 2, wherein the first electrode consists of one or more sub-electrodes extending in a first direction and a shortest distance between the sub-electrodes and two side surfaces of the second electrode of the groove shape is 1~4.5 μm.

7. The array substrate of claim 1, wherein the base substrate has a groove region extending in a first direction and the second electrode is disposed on the base substrate in compliance with the base substrate's shape to be formed in the groove shape.

8. The array substrate of claim 7, wherein a longitudinal section of the groove region in a second direction perpendicular to the first direction is of a reversed trapezoid.

9. The array substrate of claim 8, wherein an angle between at least one side surface of the second electrode of the groove shape and the base substrate is neither 0° nor 90°.

10. The array substrate of claim 7, wherein the first electrode consists of one or more sub-electrodes extending in a first direction and a shortest distance between the sub-electrodes and two side surfaces of the second electrode of the groove shape is 1~4.5 μm.

11. The array substrate of claim 1, further comprising:
    a plurality of gate lines provided in the first direction and a plurality of data lines provided in the second direction perpendicular to the first direction around sub-pixels, a second insulating layer being on the gate lines; or
    a plurality of data lines provided in the first direction and a plurality of gate lines provided in the second direction perpendicular to the first direction around sub-pixels, the second insulating layer being on the data lines.

12. The array substrate of claim 11, wherein the second insulating layer comprises transparent resin or black light blocking resin.

13. A liquid crystal panel comprising an array substrate according to claim 1.

14. A display device comprising a liquid crystal panel according to claim 13.

15. The array substrate of claim 1, wherein the two edge portions of the first electrode are closer to the base substrate than the two edge portions of the second electrode.

16. A manufacturing method of an array substrate, comprising:
    forming a pattern of a first electrode and a pattern of a second electrode in a sub-pixel region on a base substrate and a first insulating layer between the first electrode and the second electrode,
    wherein a surface of the second electrode is a curved surface, the second electrode is of a groove shape and comprises two opposite side surfaces, the first electrode is provided on the second electrode and comprises two opposite side surfaces, and the two side surfaces of the first electrode are between the two side surfaces of the second electrode;
    the two side surfaces of the first electrode are two edge portions of the first electrode of the sub-pixel region, the two side surfaces of the second electrode are two edge portions of the second electrode of the sub-pixel region; and
    a remaining portion of the second electrode is closer to the base substrate than the two edge portions of the second electrode.

17. The method of claim 16, wherein a second insulating layer of a thickness is formed on the base substrate and a groove region extending in a first direction is formed in a preset region of the second insulating layer;
    a second conductive layer is formed on the base substrate with the second insulating layer formed thereon, the pattern of the second electrode is formed on the second insulating layer, with the second electrode disposed on the second insulating layer being in compliance with the second insulating layer's shape to be formed in the groove shape;
    the first insulating layer is formed on the base substrate with the second electrode formed thereon, for insulating the second electrode and the first electrode to be formed;
    a first conductive layer is formed on the base substrate with the first insulating layer formed thereon, and the pattern of the first electrode is formed on the first insulating layer.

18. The method of claim 17, wherein a depth of the groove region of the second insulating layer is equal to or less than a thickness of a region other than the groove region of the second insulating layer.

19. The method of claim 16, wherein
    a groove region extending in a first direction is formed in a preset region on the base substrate;

a second conductive layer is formed on the base substrate with the groove region formed thereon, the pattern of the second electrode is formed on the base substrate, with the second electrode disposed on the base substrate being in compliance with the base substrate's shape to be formed in the groove shape;

the first insulating layer is formed on the base substrate with the second electrode formed thereon, for insulating the second electrode and the first electrode to be formed;

a first conductive layer is formed on the base substrate with the first insulating layer formed thereon, and the pattern of the first electrode is formed on the first insulating layer.

\* \* \* \* \*